United States Patent [19]

Taylor, Jr.

[11] Patent Number: 4,921,776

[45] Date of Patent: May 1, 1990

[54] METHOD OF PROVIDING LOWER GLOSS PROTECTIVE COVERING FOR PRE-PRESS COLOR PROOF

[75] Inventor: Harvey W. Taylor, Jr., Sayre, Pa.

[73] Assignee: E. I. du Pont de Nemours and Company, Wilmington, Del.

[21] Appl. No.: 285,312

[22] Filed: Nov. 30, 1988

Related U.S. Application Data

[63] Continuation of Ser. No. 31,613, Mar. 30, 1987, abandoned.

[51] Int. Cl.$^5$ ............................................. G03C 1/66
[52] U.S. Cl. ..................................... 430/293; 430/18; 430/273; 430/950; 430/961
[58] Field of Search ............... 430/950, 192, 193, 270, 430/271, 279, 18, 961

[56] References Cited

U.S. PATENT DOCUMENTS

| | | | |
|---|---|---|---|
| 3,397,980 | 8/1968 | Stone | 96/50 |
| 3,649,268 | 3/1972 | Chu et al. | 96/27 R |
| 3,671,236 | 6/1972 | Van Beusekom | 96/15 |
| 3,697,277 | 10/1972 | King | 96/50PL |
| 3,811,882 | 5/1974 | Henry | 96/13 |
| 3,811,924 | 5/1974 | Gallagher et al. | 430/950 |
| 4,053,313 | 10/1977 | Fan | 96/36 |
| 4,077,830 | 3/1978 | Fulwiler | 156/249 |
| 4,168,979 | 9/1979 | Okishi et al. | 96/75 |
| 4,174,216 | 11/1979 | Cohen et al. | 430/257 |
| 4,232,117 | 11/1980 | Naoi et al. | 430/950 |
| 4,235,959 | 11/1980 | Thijs | 430/531 |
| 4,238,560 | 12/1980 | Nakamura et al. | 430/162 |
| 4,286,046 | 8/1981 | Cohen et al. | 430/272 |
| 4,298,682 | 11/1981 | Bishop | 430/950 |
| 4,323,636 | 4/1982 | Chen | 430/271 |
| 4,329,420 | 5/1982 | Bopp | 430/293 |
| 4,357,418 | 11/1982 | Cellone | 430/950 |
| 4,367,284 | 1/1983 | Cellone et al. | 430/950 |
| 4,376,159 | 3/1983 | Spechler | 430/293 |

OTHER PUBLICATIONS

Southworth, Pocket Guide to Color Reproduction, pp. 28–33, 1979.

*Primary Examiner*—Jack P. Brammer

[57] ABSTRACT

Method of providing an image-bearing surface, e.g., a pre-press proof, with a protective covering, comprising laminating to said surface a thin, substantially transparent integral polymeric film, the improvement wherein the polymeric film consists essentially of a mixture of at least two slightly incompatible polymers, whereby the film exhibits a 20° specular gloss that is at least 5% lower than the gloss of a film prepared from any one of said polymer constituents.

43 Claims, No Drawings

4,921,776

METHOD OF PROVIDING LOWER GLOSS PROTECTIVE COVERING FOR PRE-PRESS COLOR PROOF

This application is a continuation of application Ser. No. 07/031,613 filed 3/30/87 now abandoned.

FIELD OF THE INVENTION

This invention relates to a protective covering for imaged surfaces having a predetermined level of gloss. More particularly, it relates to a protective polymeric overcoat layer for an image-bearing surface having a controlled level of lower gloss.

BACKGROUND OF THE INVENTION

In preparing an image-bearing photosensitive surface, such as a pre-press proof or a photograph, it is frequently desirable to provide a protective covering to prevent or limit scratching, marring, or other damage to the image-bearing surface. Such a covering must be optically clear so as not to obscure or distort the image. It should also have flexibility, durability, and good adhesion to the image-bearing photosensitive element.

Items or objects that people use or see in their daily lives range in appearance from high gloss to dull or flat. Highly glossy surfaces reflect a high proportion of the light directed at them specularly. Gloss can be defined as the degree to which the finish of a surface approaches a perfect mirror. The closer the surface comes to approximating the front surface of a mirror, the higher the gloss. Gloss can be measured at many different angles, but the gloss of the surface increases with increasing angle of incidence from a line drawn perpendicular to the surface. Small angles of incidence, e.g., 20°, serve better to distinguish between examples exhibiting high gloss and are a better indication of gloss as perceived by the human eye. In measuring specular gloss, those skilled in the art use higher angle methods, e.g., 85°, to distinguish between lower gloss specimens and low angle methods, e.g., 20°, to distinguish between high gloss samples. In general, the polymeric films described in this patent fall into the high gloss category and the most meaningful measure of gloss is, therefore, the gloss measurement at 20°.

Since gloss significantly affects the appearance of an image, one of the most important requirements for an overcoat or protective covering for an image-bearing surface is the ability to achieve the desired degree of gloss. In many instances, it is desirable to modify the light reflectivity of a photograph or other imaged surface to reduce high gloss. In the photoimaging and image reproduction industry, it is desirable to modify the light reflectivity of the photosensitive materials which are used to prepare pre-press color proofs, and, more particularly, to be able to match the gloss of the finished proof to that of the ultimate presssprinted product. High gloss protective coverings or coversheets on pre-press multilayer color proofs, which are designed to permit evaluation of color rendition before the actual printing run, interfere with the accurate assessment of color fidelity throughout the lithographic tone scale. This result is generally unacceptable to critical users of pre-press proofing methods.

The exact amount of gloss desired on a pre-press proof will vary depending on the type of end product whose appearance is to be duplicated, but in general, a level of 50-70 gloss units (as measured by a Gardner gloss meter at 20 degrees) is suitable for the commercial market in which the end product is a poster, brochure, or other print which is made on white, bright stock. On the other hand, there is a potential for great variability in the paper or other printing stock used in this segment of the industry and it may sometimes be necessary to obtain much lower gloss levels, e.g., a 20° specular gloss lower than 25, when highly matte printing stock is to be used. Prints made for the commercial market are generally printed with a sheet-fed press to individual, custom standards, which are not usually applicable to the entire industry. The ability to vary the degree of gloss on a pre-press proof aimed at this segment of the industry is frequently of great importance, and the instant invention is particularly useful for that purpose.

Lower gloss prints suitable for the publication market, in which the end product is a magazine print, are generally made on a more yellow, darker printing stock. The actual printing is frequently performed on a web press and the gloss is generally much lower, e.g., less than about 25 gloss units. In addition, the print may have a matte appearance to lower the gloss and provide contrast for easier reading of the periodical. In these cases, the determination of specular gloss may best be performed at a grazing angle, (e.g., 85 degrees) to better distinguish between lower gloss specimens.

Photosensitive materials used in color proofing area of the positive- or negative-working types. A positive-working process is described in U.S. Pat. No. 3,649,268 to Chu and Cohen. Positive-working materials may contain tacky, photohardenable compositions which, when exposed imagewise to actinic radiation, harden in the exposed image areas, resulting in tacky and complementary nontacky image areas. The image can be developed by applying colored particulate materials such as toners or pigments which selectively adhere to the unexposed tacky image areas.

A negative-working process is described in U.S. Pat. No. 4,174,216 to Cohen and Fan, which teaches a negative-working element having a support; a tacky, nonphotosensitive contiguous layer; a photohardenable photoadherent layer; and a strippable coversheet. After imagewise exposure to actinic radiation, the coversheet is peeled away, carrying with it the exposed areas of the photoadherent layer, and baring the tacky continuous layer beneath. These areas of the tacky contiguous layer lying underneath the exposed image areas may then be toned with a finely divided particulate material. Different colored layers can be prepared and assembled in register over one another to form multilayer color proofs, as is well known to those skilled in the art. U.S. Pat. No. 4,053,313 to Fan describes a similar negative-working system which is developed by solvent washout.

Alternatively, a photosensitive imaging system may be precolored with dyes and/or pigments or other coloring materials, developed by washout, contain photoplasticizing agents instead of photohardening agents, and other variations known to those skilled in the art. Negative-working systems may be achieved in a number of different ways, for example, by utilizing a photosensitive layer which becomes tacky and tonable on exposure to actinic radiation. It is understood that in addition to various photopolymer elements, other non-silver halide systems, e.g., diazo systems, are useful in preparing multicolor proofs. In addition, the described protective polymer layers of this invention may be beneficially applied to many types of image bearing surfaces, e.g., a conventional silver halide photograph, where it is desired to provide a clear protective covering having a predetermined level of gloss. It is understood that the polymeric layers of the invention may also be applied to nonimaged glossy surfaces to obtain a desired level of lowered gloss.

Photosensitive elements have been provided with a great variety of protective coverings. U.S. Pat. No. 4,077,830 to Fulwiler (1978) teaches that photographic elements such as positives of negatives used for contact printing can be protected by application of a thin transparent sheet of resin material having a thin coating of a transparent pressure-sensitive adhesive. To avoid image distortion during printing, both the resin sheet and the adhesive layer must be extremely smooth. The protective resin sheet is preferably Mylar®, a high gloss polyethylene terephthalate film manufactured by E. I. du Pont de Nemours and Company, Wilmington, DE.

Stone, U.S. Pat. No. 3,397,980 (1968) relates to a protective laminate comprising a durable outer layer such as Type D Mylar® and a polyethylene inner layer, bonded to microfilm using a polyvinyl acetate coating. Type D Mylar® is very smooth and glossy.

Pre-press color proofs such as those described above are usually covered with one of three types of protective coverings or coversheets. The first of these is a positive-working photosensitive element as described in Chu and Cohen above, comprising a photosensitive layer and a polyester coversheet. This is exposed overall to actinic radiation and the polyester coversheet removed. This results in a proof with a desirable 20° gloss level of about 65 gloss units. It suffers, however, from poor durability and is susceptible to crazing, scratching, and marring.

The second type of topcoat or coversheet is a negative-working photosensitive element as described in Cohen and Fan, above, which comprises a polyester coversheet; a photosensitive layer; and an organic contiguous layer. This is laminated to the proof and exposed overall with the polyester coversheet left in place. The result is a proof with a more durable finish, but the gloss associated with the reflective, highly transparent integral polyester coversheet is unacceptably high, i.e., about 107 gloss units measured at 20. The unacceptability of such high gloss has long been recognized, and considerable effort has focused on ways to achieve a durable lower gloss protective coating that is resistant to crazing, scratching, marring, etc.

The third type of protective covering or coversheet is an integral layer of plastic film, such as polyester, coated with a nonphotoactive adhesive, and applied to the proof by lamination. The net result is indistinguishable from the second type of coversheet described above, in that it provides a durable covering, but one which exhibits unacceptably high gloss. For example, U.S. Pat. No. 4,329,420 to Bopp (1982) teaches a process of protecting pre-press proofs by applying a hard clear polymer layer by means of a pressure-sensitive adhesive. Bopp utilizes such high gloss materials as Mylar® polyethylene terephthalate.

A number of patents, however, teach methods of achieving a lower gloss protective coating for imaged surfaces. Many patents teach how to achieve coatings having a physically roughened or "matte" surface which diffuses light and has lowered gloss. For example, Spechler, U.S. Pat. No. 4,376,159 (1982), coats a transparent film-forming polymer on a matte-textured carrier sheet. The polymer is adhered to the surface of a color-proofing surprint with a pressure sensitive adhesive. The carrier sheet is then removed, leaving a matte-surfaced protective polymer coating on the surface of the proof.

King, U.S. Pat. No. 3,697,277 (1972) teaches a process for permanently bonding a protective coating to a photographic print. A matte-surface polyester film is placed on the wet emulsion surface of a photographic print and heat treated to permanently bond the film to the surface of the photograph.

Cohen and Fan, U.S. Pat. No. 4,286,046, recognizes the problems associated with the high gloss of a polyethylene terephthalate covering and teaches a method for delustering a photopolymer pre-press proof by applying particulate material to the tacky tonable layer.

A number of patents teach the use on photosensitive surfaces of matte layers, comprising a resin having dispersed therein insoluble particles or grains which impart a physical roughness to the surface. For example, U.S. Pat. Nos. 4,168,979 to Okishi et al., and 4,238,560, to Nakamura et al., teach a light sensitive printing plate with a matte overlayer, which is a resin layer with an insoluble particulate matting agent dispersed therein. This achieves a surface coarseness or roughness which contributes to improved exposure by the vacuum contacting method. After exposure the matte overlayer is removed with the developer. Similarly, U.S. Pat. No. 4,235,959, to This, deceased, et al., teaches a photosensitive silver halide layer incorporating a layer comprising gelatin and dispersed spherical particles which are the polycondensation product of urea, formaldehyde, and silica particles.

Although compatibility and incompatibility of polymers are recognized phenomena, the prior art does not disclose integral films prepared from blends of slightly incompatible polymers, nor does it teach how such films can be laminated to imaged surfaces to provide a controlled degree of lowered gloss. On the contrary, in general the prior art teaches that incompatibility is undesirable and to be avoided.

U.S. Pat. No. 3,671,236, to Van Beusekom, teaches that in preparing a proof by superimposing a plurality of colored sheets, the individual sheets must be perfectly colorless and optically transparent in order to avoid any "haze" or imperfection being multiplied in the several sheets.

U.S. Pat. No. 4,323,636 to Chen teaches that in order to obtain a transparent, i.e., nonlight-scattering, photosensitive composition for preparing printing plates, the binder and the monomer must be compatible. Incompatibility is evidenced by the formation of haze in the photosensitive composition. By compatibility is meant the ability of the constituents to remain dispersed with one another without causing appreciable scattering of light. This occurs when the monomer is soluble in either of the component blocks of the block copolymer. Chen teaches only how to avoid incompatibility of polymer and monomer in photopolymerizable compositions. It does not deal with compatibility/incompatibility of blends of polymers, nor does it suggest any utility for such incompatibility.

Gallagher et al., U.S. Pat. No. 3,811,924 (1974) teaches that an aqueous lacquer coating composition which is a blend of polymers consisting essentially of an ammonium salt of a copolymer of ethyl methacrylate and methacrylic acid together with poly(vinyl acetate) can be applied to glossy surfaces to provide a degree of roughness or "matte". Gallagher also teaches, however, that otherwise similar non-ammonium polymer mixtures laid down from an organic solvent system would lack the desirable matte finish. The polymeric films of the invention are not ammonium salts, and they are coated on a substrate from an essentially organic solvent system to form a smooth, low gloss integral film prior to laminating to the image-bearing surface.

BRIEF SUMMARY OF THE INVENTION

The invention relates to a protective covering for laminating to an image-bearing surface, comprising a thin, substantially transparent, integral polymeric film, the improvement wherein said polymeric film consists essentially of a mixture of at least two slightly incompatible polymers, whereby said film exhibits a 20° specular gloss that is at least 5% lower than the gloss of a film prepared from any one of said polymer constituents.

The invention relates further to a method of providing an image-bearing surface with a protective covering, comprising laminating to the image-bearing surface a thin, substantially transparent integral polymeric film, the improvement wherein the polymeric film consists essentially of a blend of at least two slightly incompatible polymers, whereby said film exhibits a 20° specular gloss that is at least 5% lower than the gloss of a film prepared from any one of said polymer constituents.

DETAILED DESCRIPTION OF THE INVENTION

Polymer compatibility as defined herein is the ability of a mixture of two or more polymer constituents to remain dispersed within one another without causing appreciable scattering of light. Polymer compatibility is related to the relative proportions of the polymeric constituents of the mixture, i.e., a particular combination of polymers may exhibit incompatibility only in certain proportions. Polymer incompatibility is evidenced by the formation of haze in the cast film. The haze can be due to the formation of polymer domains, which scatter light rather than specularly reflect it. As long as the polymer domains are smaller than the wavelength of the light passing through the film, no significant image impairment will result from light scatter. If two or more polymers are only slightly incompatible, a film prepared from a blend or mixture of such polymers, when applied as a covering to a proof, will lower the gloss of the proof without impairing the clarity of the image. In other words, the film will be substantially transparent, with an absence of perceptible haze, but will exhibit lowered gloss relative to films prepared from the pure polymers.

If the polymers are too incompatible the resulting film will be too hazy and when applied to a proof will give an image that is muddy or blurred. Ultimately, if the polymers are grossly incompatible, it may not be possible to make an integral film from them at all without incurring such problems as "orange peel" or other film structure problems.

For purposes of this application, slightly incompatible polymers are defined as two or more polymers that may be blended in at least some proportions to form a substantially transparent integral film which exhibits a gloss lower than a film formed for any one, i.e., the one which exhibits the lowest gloss, of the component polymers. Preferably, the slightly incompatible polymers must be capable of forming a film which has a gloss at least 5% lower than any one of the component incompatible polymers. More preferably, the slightly incompatible polymers should be capable of forming a film having a gloss at least 10% lower than a film formed from any one of the component incompatible polymers. It is frequently possible, however, to utilize the slightly incompatible polymers of the invention to achieve a very substantial lowering of gloss, e.g. in the range of 75% or more.

In general, it is an object of this invention to provide a topcoat or protective polymeric covering for image-bearing photosensitive surfaces, including pre-press color proofs, which will exhibit a 20° specular gloss having a predetermined value in the range of about 40 to 80 gloss units, more preferably, 50-70 gloss units, while providing adequate protection from scratching and marring. It is a further object of this invention to provide protective polymeric coverings for image bearing surfaces having a broad range of lower gloss levels. In some instances it may be desirable to apply a protective covering having a 20° specular gloss less than 40 gloss units, and sometimes even lower than 25 gloss units.

Slight polymer incompatibility as defined herein is a general phenomenon which has been demonstrated with films prepared from mixtures of polymers of a number of different chemical compositions. For example, this phenomenon has been demonstrated with films prepared from mixtures of the following polymers:

Ex. (1) a 60/40 ethylene/vinylacetate copolymer of medium molecular weight (inherent viscosity=0.70 measured at 30° C., 0.25 g polymer in 100 ml toluene) (Elvax® 40w, E. I. du Pont de Nemours and Company, Wilmington, DE) and a polymethylmethacrylate of high molecular weight (inherent viscosity 1.38 at 20° C., 0.25 g polymer in 50 ml chloroform, No. 50 Cannon-Fenske Viscometer) (Elvacite®2051, E. I. du Pont de Nemours and Company, Wilmington, DE):

EX. (2) a 60/40 ethylene/vinylacetate copolymer of medium molecular weight (inherent viscosity=0.70 measured at 30° C., 0.25 g polymer in 100 ml toluene) (Elvax® 40w, E. I. du Pont de Nemours and Company, Wilmington, DE); a polymethylmethacrylate of high molecular weight (inherent viscosity 1.38 at 20° C., 0.25 g polymer in 50 ml chloroform, No. 50 Cannon-Fenske Viscometer) (Elvacite®2051, E. I. du Pont de Nemours and Company, Wilmington, DE); and a polyvinylacetate of medium molecular weight (Brookfield viscosity=825 cps at 20° C., 60 rpm, 30% polymer in benzene) (Vinac® B-15, Air Products, Allentown, PA);

EX. (3) a polycarbonate of high molecular weight (melt index=3, ASTM D-1238, Condition O) (Calibre® 300-3, Dow Chemical, Midland, MI) and a polymethylmethacrylate of high molecular weight (inherent viscosity 1.38 at 20° C., 0.25 g polymer in 50 ml chloroform, No. 50 Cannon-Fenske Viscometer) (Elvacite®2051, E. I. du Pont de Nemours and Company, Wilmington, DE);

EX. (4) a polycarbonate of high molecular weight (melt index=3, ASTM D-1238, Condition O) (Calibre° 300-3, Dow Chemical, Midland, MI) and a polystyrene of high molecular weight (melt index=1.6, ASTM D-1238, Condition G) (Styron® 685D, Dow Chemical, Midland, MI);

EX. (5) a polyamide of high molecular weight (melt index of 5-15 at 347° F.) (Macromelt® 6900, Henkel Corp., Minneapolis, MN) and a polyamide of high molecular weight (viscosity=40-60 poise at 410° (Macromelt ® 6238, Henkel Corp., Minneapolis, MN);

EX. (6) a polyamide of high molecular weight (melt index of 5-15 at 347° F.) (Macromelt ® 6900, Henkel Corp., Minneapolis, MN) and a polybutylmethacrylate resin (Brookfield viscosity=235-325 cps at 25° C., 40% solution in toluene) (Acryloid ® B66, Rohm and Haas, Philadelphia, PA);

EX. (7) a polyester of medium molecular weight (Brookfield viscosity=500 cps at 20° C., 30% polymer in toluene) (Vitel ® 222, Goodyear Tire and Rubber Co., Akron, OH) and a polybutylethacrylate resin (Brookfield viscosity=235-325 cps at 25° C., 40% solution in toluene) (Acryloid ® B66, Rohm and Haas, Philadelphia, PA);

EX. (8) a polyester of medium molecular weight (Brookfield viscosity=500 cps at 20° C., 30% polymer in toluene) (Vitel ® 222, Goodyear Tire and Rubber Co., Akron, OH) and a polystyrene of high molecular weight (melt index=1.6, ASTM D-1238, Condition G) (Styron ® 685D, Dow Chemical, Midland, MI);

EX. (11) a polymethylmethacrylate of high molecular weight (inherent viscosity 1.38 at 20° C., 0.25 g polymer in 50 ml chloroform, No. 50 Canon-Fenske Viscometer) (Elvacite ® 2051, E. I. du Pont de Nemours and Company, Wilmington, DE); a polyvinylacetate of medium molecular weight (Brookfield viscosity=825 cps at 20° C., 60 rpm, 30% polymer in benzene) (Vinac ® B-15, Air Products, Allentown, PA); and a polyethylene glycol of low molecular weight (minimum Brookfield viscosity=100 cst at 38° C., 25% polymer in water) (Carbowax ® 20M, Union Carbide, Danbury, Ct.).

Accordingly, the following are examples of mixtures of slightly incompatible polymers which can be used to prepare polymeric films having the desired lowering of gloss: (a) an ethylene/vinylacetate copolymer and polymethylmethacrylate; (b) an ethylene/vinylacetate copolymer, polymethylmethacrylate, and polyvinylacetate; (c) polycarbonate and polymethylmethacrylate; (d) polycarbonate and polystyrene; (e) polyamides; (f) polybutylmethacrylate and a polyamide; (g) a polyester and polybutylmethacrylate; (h) a polyester and polystyrene; (i) polyvinylacetate, polymethylmethacrylate, and polyethylene glycol.

Preferred is a protective covering wherein the polymeric film consists essentially of a mixture of at least two slightly incompatible polymers selected from: (a) an ethylene/vinylacetate copolymer and polymethylmethacrylate; (b) an ethylene/vinylacetate copolymer, polymethylmethacrylate, and polyvinylacetate; (c) polycarbonate and polymethylmethacrylate; (d) polycarbonate and polystyrene; and (e) polyvinylacetate, polymethylmethacrylate, and polyethylene glycol.

More preferred mixtures of slightly incompatible polymers are (1) an ethylene/polyvinylacetate copolymer, polymethylmethacrylate, and polyvinylacetate, and (2) polymethylmethacrylate, polyvinylacetate, and polyethylene glycol.

Specifically preferred is a polymer film which consists essentially of about 10-90% polymethylmethacrylate, 10-90% polyvinylacetate, and 2-30% polyethylene glycol.

Particularly preferred is a polymeric film as described in Example 13, which consists essentially of a mixture of slightly incompatible polymers which is about 65% polymethylmethacrylate, about 29% polyvinylacetate, and about 4% polyethylene glycol, and which exhibits a 20° specular gloss of about 54 gloss units when coated from a methylene chloride/isopropanol solution.

While it is generally not possible to predict in advance which combinations of polymers will exhibit the desired slight incompatibility and in what proportions, it is a relatively simple matter for those skilled in the art to follow the teaching set forth herein to determine whether or not a film prepared from a particular blend of polymers does or does not exhibit the desired lowering of gloss. By measuring the gloss of films formed from varying proportions of two or more slightly incompatible polymers, it is possible to choose a film having the desired degree of lowered gloss. It frequently is possible to prepare a substantially transparent film having a gloss value much lower than any of the individual polymer components. This effect of slight polymer incompatibility results in an expanded range of gloss values within a single system of polymers, and may enable preparation of a protective film having a particular level of gloss, together with the other characteristics needed in a protective covering applied to an imaged surface.

The protective polymeric covering should be thick enough to ensure structural integrity, but thin enough to avoid distortion of the image through a three-dimensional effect. In general, the coating weight of the polymeric layer should be in the range of about 40-200 mg/dm$^2$. The final thickness of this layer should not exceed about 0.002 cm, and is preferably about 0.001 cm thick.

The Wetting Layer

Depending on the nature of the imaged surface on which the protective covering is to be used, it is sometimes necessary to add a second, "wetting layer" or adhesive layer, which is disposed between the polymeric film of the invention and the imaged surface. Such a layer may be particularly useful when the imaged surface is a tacky composition which has been toned with a colored particulate material. When the protective polymeric covering is placed directly on a toned image of this type, it is sometimes observed that the optical density changes with time over the course of several hours before reaching its equilibrium level. It is believed that this may be due to incomplete wetting of the toned surface. When a "wetting layer" is used with the protective polymeric covering, the equilibrium optical density is achieved immediately after lamination. Of course, even when the imaged surface to be protected by the polymeric film does not require a "wetting layer" per se, it may be necessary or desirable to use an adhesive layer to improve adhesion.

The wetting or adhesive layer may be chosen from a great number of materials that will wet or flow into the toned areas. Preferably, this layer will be of a clear, nonphotosensitive, tacky or slightly soft deformable organic material. Particularly preferred materials are elastomeric polymers and mixtures thereof. Rubber type polymers, both natural and synthetic, may be used, e.g., polyisobutylene, Thiokol A, nitrile rubbers, butyl rubber, chlorinated rubbers, polymers of butadiene, poly(vinylisobutylether), polyisoprene, and random, teleblock and block copolymers of butadiene or isoprene copolymerized with styrene, and neoprene, silicone elastomers, etc., in various proportions. Additionally, any highly plasticized thermoplastic polymeric film will function as a wetting layer. As is readily apparent to those skilled in the art, the wetting layer may also contain such ingredients as tackifiers, anti-oxidants, etc. Any suitable solvent may be used to coat the wetting layer. The coating weight of the wetting layer may be varied over a wide range and is primarily determined by the other physical property requirements of the system. That is, the minimum coating weight is that which will provide a film with sufficient thickness to laminate evenly over the imaged surface. The maximum coating weight is that which will provide a film which will not distort the image, i.e., give a three-dimensional appearance. In general, the wetting layer should have a coating weight in the range of 10–100 mg/dm$^2$, and preferably 50 mg/dm$^2$. As noted above, the coating weight of the protective polymeric layer alone should be in the range of about 40–200 mg/dm$^2$, and the thickness of this layer should not exceed 0.002 cm, preferably about 0.001 cm. Accordingly, the thickness of the wetting layer should be such that the total thickness of the finished coversheet, i.e., protective polymeric covering and wetting layer combined, does not exceed about 0.002 cm.

As will be readily apparent to those skilled in the art, the protective covering of the invention may have additional layers adjacent to the protective polymeric layer and adjacent to the wetting layer to facilitate handling and storage. Such additional layers may be particularly useful if the protective covering is to be stored in a roll prior to use. The covering on the wetting layer would be removed prior to lamination to the imaged surface; the covering on the protective polymeric film layer would preferably be removed after lamination. Suitable materials for these additional coverings would include silicone-treated polyester, polyethylene, etc., which release readily from the layer they serve to protect.

The phase "consisting essentially of" is intended to the present disclosure to have its customary meaning, namely, that the films of the invention are limited to the specified ingredients and other ingredients that do not materially affect the basic and novel characteristics of the compositions claimed. For example, while it is understood that the polymer films must contain at least two slightly incompatible polymers, other compatible or slightly incompatible polymers may also be present when needed to achieve a film having a particular set of properties. It is also understood that the compositions may include a variety of additives, such as optical brighteners, anti-oxidants, coating aids, UV light attenuators, etc. In other words, unspecified materials are not excluded so long as they do not prevent the benefits of the invention from being realized.

Furthermore, as is well known to those skilled in the art, commercially available polymers of the type described herein may contain small amounts of other polymerized material. It is intended that the chemical descriptions given are interpreted to mean those polymers that are substantially made up of the monomer(s) indicated. For example, a commercial polymethylmethacrylate will frequently contain a few percent of ethylmethacrylate. It is comtemplated that such copolymers will fall within the invention as disclosed.

EXAMPLES

The following examples illustrate some combinations of slightly incompatible polymers which can be utilized to prepare integral films having various degrees of lowered gloss, which may be useful as a protective covering or coversheet for pre-press color proofs, photographs, or other imaged surfaces. These examples demonstrate how the amount of gloss can be varied by blending various polymers in different proportions. It can be seen that blends of slightly incompatible polymers provide an expanded range of gloss levels within a particular system of polymers. Other combinations of slightly incompatible polymers useful for preparing optically clear integral films having a desirable range of reduced gloss values can be determined by measuring the specular gloss of easily prepared test films.

Gloss measurements are made using a Gardner Glossgard Digital Model glossmeter (Gardner Co., Bethesda, MD) at a 20° angle of incidence. Before actual measurements are taken on the samples, care was taken to insure proper calibration of the glossmeter at each of the angles by reading and adjusting (as necessary) the values obtained for white and black tile standards provided by the manufacturer. The range of the Glossgard glossmeter is 0.0–199.9 gloss units with a precision of +/−0.5 gloss units. Once the instrument has been calibrated, successive gloss measurements within a series may be compared. The gloss of a sample was measured by placing the glossmeter's aperture in the middle of the sample and recording the gloss value taken at a 20° angle of incidence. Care was also taken to insure that the direction of measurements on the samples relative to the aperture was the same for all samples and in particular, within the polymeric series being evaluated. All laminations were performed at 210–250° F. on a Cromalin ® laminator, manufactured by E. I. du Pont de Nemours and Company, Wilmington, DE. Unless otherwise specified, all gloss values are in gloss units and all quantities are in grams.

Examples 1–9

The polymer films were prepared by dissolving the named polymers in the varying proportions listed for each example in the organic solvent or mixture of solvents indicated to form a 15% w/w solution. The ingredients were thoroughly mixed and coated onto a 0.00254 cm thick silicone-treated transparent polyethylene terephthalate support using a 0.005 cm doctor blade. After drying, the resulting film had a thickness of 0.0008 cm. The polymeric films of the invention are prepared by coating from an essentially organic solvent system. This solvent system is a single organic solvent or mixture of organic solvents suitable for dissolving the particular mixture of slightly incompatible polymers. As can be seen by comparing Examples 1 and 9, the choice of organic solvent system may affect the gloss of the resulting film.

Examples 1–13 were carried out with a negative-working photosensitive element similar to that described in Cohen and Fan, U.S. Pat. No. 4,174,216, the teaching of which is incorporated by reference. This negative-working element comprises, in order from top to bottom, (1) a strippable cover sheet, (2) a photoadherent layer comprising a material with ethylenically unsaturated or benzophenone type groups, which is generally nontacky, (3) a tonable organic contiguous layer, i.e., a tacky, nonphotosensitive elastomeric layer which is tonable by application of particulate material, and (4) a sheet support. The samples were prepared by laminating the above element (after removal of the sheet support) to a support comprising polyethylene-coated paper, and removing the strippable polyester coversheet. The polymeric test film on silicone-treated polyester was then laminated to the surface of the element such that the polymer film was in surface-to-surface contact with the photoadherent layer. The silicone-treated polyester support was then removed, and the gloss measurements were carried out as described above.

Example 14 utilizes a layer of positive Cromalin® (E. I. du Pont de Nemours and Company, Wilmington, DE), similar to the positive-working photopolymerizable element described in U.S. Pat. No. 3,649,268, Example number 3.

Example 1

|  | A | B | C | D | E | F | G | H | I |
|---|---|---|---|---|---|---|---|---|---|
| Methylene Chloride | 170 | 170 | 170 | 170 | 170 | 170 | 170 | 170 | 170 |
| E/PVAc[1] | 0 | 3 | 6 | 9 | 12 | 15 | 18 | 24 | 30 |
| PMMA[1] | 30 | 27 | 24 | 21 | 18 | 15 | 12 | 6 | 0 |
| % E/PVAc | 0 | 10 | 20 | 30 | 40 | 50 | 60 | 80 | 100 |
| % PMMA | 100 | 90 | 80 | 70 | 60 | 50 | 40 | 20 | 0 |
| GLOSS 20° | 42.0 | 39.8 | 18.7 | 14.8 | 9.7 | 12.3 | 14.7 | 39.3 | 46.0 |

[1] E/PVAc = 60/40 ethylene/vinylacetate copolymer, inherent viscosity = 0.70 measured at 30° C., 0.25 g polymer in 100 ml toluene. Elvax ® 40w, E. I. du Pont de Nemours and Company, Wilmington, DE. PMMA = polymethylmethacrylate inherent viscosity = 1.38 at 20° C., 0.25 g of polymer in 50 ml chloroform. No. 50 Cannon-Fenske Viscometer. Elvacite ® 2051. E. I. du Pont de Nemours and Company, Wilmington, DE.

Example 2

|  | A | B | C | D | E | F | G | H | I |
|---|---|---|---|---|---|---|---|---|---|
| Methylene Chloride | 170 | 170 | 170 | 170 | 170 | 170 | 170 | 170 | 170 |
| E/PVAc[1] | 0 | 3 | 7.5 | 12 | 15 | 18 | 21 | 24 | 27 |
| PMMA[1] | 30 | 13.5 | 11.3 | 9 | 7.5 | 6 | 4.5 | 3 | 1.5 |
| PVAc[2] | 0 | 13.5 | 11.3 | 9 | 7.5 | 6 | 4.5 | 3 | 1.5 |
| % E/PVAc | 0 | 10 | 25 | 40 | 50 | 60 | 70 | 80 | 90 |
| % PMMA | 100 | 45 | 37.5 | 30 | 25 | 20 | 15 | 10 | 5 |
| % PVAc | 0 | 45 | 37.5 | 30 | 25 | 20 | 15 | 10 | 5 |
| GLOSS 20° | 42.0 | 45.3 | 31.3 | 20.7 | 14.4 | 27.4 | 28.3 | 38.9 | 46.5 |

[2] PVAc = polyvinylacetate. Brookfield viscosity = 825 cps at 20° C., 60 RPM, 30% polymer in benzene. Vinac ® B-15, Air Products Corp., Allentown, PA.

Example 3

|  | A | B | C | D | E | F |
|---|---|---|---|---|---|---|
| Methylene Chloride | 170 | 170 | 170 | 170 | 170 | 170 |
| PC[3] | 30 | 24 | 18 | 12 | 6 | 0 |
| PMMA[1] | 0 | 6 | 12 | 18 | 24 | 30 |
| % PC | 100 | 80 | 60 | 40 | 20 | 0 |
| % PMMA | 0 | 20 | 40 | 60 | 80 | 100 |
| GLOSS 20° | 64.6 | 58.0 | 43.3 | 47.6 | 48.3 | 50.0 |

[3] PC = polycarbonate, melt index = 3 (ASTM D-1238, Condition O). Calibre ® 300-3, Dow Chemical, Midland, MI.

Example 4

|  | A | B | C | D | E | F | G |
|---|---|---|---|---|---|---|---|
| Methylene Chloride | 170 | 170 | 170 | 170 | 170 | 170 | 170 |
| PC[3] | 30 | 24 | 18 | 15 | 12 | 6 | 0 |
| S[4] | 0 | 6 | 12 | 15 | 18 | 24 | 30 |
| % PC | 100 | 80 | 60 | 50 | 40 | 20 | 0 |
| % S | 0 | 20 | 40 | 50 | 60 | 80 | 100 |
| GLOSS 20° | 64.6 | 67.2 | 64.0 | 63.5 | 60.7 | 63.5 | 68.7 |

[4] S = polystyrene, melt index = 1.6 (ASTM D-1238, Condition G). Styron ® 685D, Dow Chemical, Midland, MI.

Example 5

|  | A | B | C | D | E | F |
|---|---|---|---|---|---|---|
| Methylene Chloride | 157 | 157 | 157 | 157 | 157 | 157 |
| Methanol | 13 | 13 | 13 | 13 | 13 | 13 |
| Macromelt ® 6900[5] | 30 | 24 | 18 | 12 | 6 | 0 |
| Macromelt ® 6238[5] | 0 | 6 | 12 | 18 | 24 | 30 |
| % Macromelt ® 6900[5] | 100 | 80 | 60 | 40 | 20 | 0 |
| % Macromelt ® 6238[5] | 0 | 20 | 40 | 60 | 80 | 100 |
| GLOSS 20° | 46.0 | 46.2 | 38.6 | 19.6 | 27.3 | 43.7 |

[5] Macromelt ® is a registered trademark for polyamide resins made by the Henkel Corp., Minneapolis, MN.

Example 6

|  | A | B | C | D | E | F | G |
|---|---|---|---|---|---|---|---|
| Methylene Chloride | 157 | 157 | 157 | 157 | 157 | 157 | 157 |
| Methanol | 13 | 13 | 13 | 13 | 13 | 13 | 13 |
| Macromelt ® 6900[5] | 30 | 6 | 12 | 15 | 18 | 24 | 0 |
| PBMA[6] | 0 | 24 | 18 | 15 | 12 | 6 | 30 |
| % Macromelt ® 6900 | 100 | 20 | 40 | 50 | 60 | 80 | 0 |
| % PBMA | 0 | 80 | 60 | 50 | 40 | 20 | 100 |
| GLOSS 20° | 46.0 | 34.7 | 25.2 | 26.0 | 21.7 | 47.0 | 47.5 |

[6] PBMA = polybutylmethacrylate. Brookfield Viscosity = 235–325 cps at 25° C., 40% solution in toluene. Acryloid ® B66, Rohm and Haas, Philadelphia, PA.

Example 7

|  | A | B | C | D | E | F |
|---|---|---|---|---|---|---|
| Methylene Chloride | 170 | 170 | 170 | 170 | 170 | 170 |
| Vitel ® 222[7] | 30 | 24 | 18 | 12 | 6 | 0 |
| PBMA[6] | 0 | 6 | 12 | 18 | 24 | 30 |
| % Vitel ® 222 | 100 | 80 | 60 | 40 | 20 | 0 |
| % PBMA | 0 | 20 | 40 | 60 | 80 | 100 |
| GLOSS 20° | 65.4 | 4.97 | 49.3 | 39.8 | 49.3 | 45.0 |

[7] Vitel ® is a registered trademark for a polyester (Brookfield viscosity = 500 cps at 20° C., 30% polymer in toluene) made by the Goodyear Tire & Rubber Co., Akron, OH.

Example 8

|  | A | B | C | D | E | F | G |
|---|---|---|---|---|---|---|---|
| Methylene Chloride | 170 | 170 | 170 | 170 | 170 | 170 | 170 |
| Vitel ® 222[7] | 0 | 6 | 12 | 15 | 18 | 24 | 30 |
| S[4] | 30 | 24 | 18 | 15/12 | 6 | 0 |  |
| % Vitel ® 222 | 0 | 20 | 40 | 50 | 60 | 80 | 100 |
| % S | 100 | 80 | 60 | 50 | 40 | 20 | 0 |
| GLOSS 20° | 71.2 | 54.4 | 52.1 | 49.8 | 36.1 | 48.1 | 65.4 |

Example 9

|  | A | B | C | D | E | F |
|---|---|---|---|---|---|---|
| Toluene | 170 | 170 | 170 | 170 | 170 | 170 |
| E/PVAc[1] | 30 | 6 | 12 | 18 | 24 | 0 |
| PMMA[1] | 0 | 24 | 18 | 12 | 6 | 30 |
| % E/PVAc | 100 | 20 | 40 | 60 | 80 | 0 |
| % PMMA | 0 | 80 | 60 | 40 | 20 | 100 |
| GLOSS 20° | 37.7 | 33.6 | 10.4 | 25.0 | 39.2 | 49.0 |

Comparing Examples 1 and 9 demonstrates that the organic solvent from which a mixture of slightly incompatible polymers is coated can affect the gloss of the resulting film, but that the gloss lowering effect which characterizes such polymer mixtures occurs with different organic solvents or mixtures of solvents.

Example 10

The following example demonstrates that two polymers which are very compatible with one another can be blended without any significant lowering of the gloss of the resulting film. In this case, both polyvinylacetate and polymethylmethacrylate films exhibit similar gloss values, and the films prepared from these two polymers blended in various proportions did not show the characteristic decrease in gloss associated with slight polymer incompatibility.

|  | A | B | C | D | E | F |
|---|---|---|---|---|---|---|
| Methylene Chloride | 170 | 170 | 170 | 170 | 170 | 170 |
| PMMA[1] | 30 | 24 | 18 | 12 | 6 | 0 |
| PVAc[2] | 0 | 6 | 12 | 18 | 24 | 30 |
| % PMMA | 100 | 80 | 60 | 40 | 20 | 0 |
| % PVAc | 0 | 20 | 40 | 60 | 80 | 100 |
| GLOSS 20° | 43.1 | 45.6 / 46.5 | 46.6 | 46.7 | 43.3 | 0 |

Example 11

The following example demonstrates that a small amount of a slightly incompatible polymer can significantly lower the gloss of the resulting film. In this case polyethylene glycol is added to lower the gloss of the mixture of polymethylmethacrylate and polyvinylacetate in Example 10. Polyethylene oxide appears to have no effect.

|  | A | B | C | D | E |
|---|---|---|---|---|---|
| Methylene Chloride | 170 | 170 | 170 | 170 | 170 |
| PMMA[1] | 30 | 19.7 | 20.4 | 19.6 | 0 |
| PVAc[2] | 0 | 9.1 | 9.4 | 9.0 | 30 |
| PEG[8] | 0 | 1.2 | 0 | 1.2 | 0 |
| PEO[8] | 0 | 0 | 0.7 | 0.7 | 0 |
| % PMMA | 100 | 65.7 | 68.0 | 65.3 | 0 |
| % PVAc | 0 | 30.3 | 31.3 | 30.0 | 100 |
| % PEG | 0 | 4.0 | 0 | 4.0 | 0 |
| % PEO | 0 | 0 | 0.7 | 0.7 | 0 |
| GLOSS 20° | 55.5 | 49.0 | 52.0 | 49.1 | 52.6 |

[8] PEG = polyethylene glycol, minimum Brookfield viscosity = 100 cst at 38° C., 25% polymer in water, Carbowax ® 20M, Union Carbide, Danbury, Ct. PEO = polyethylene oxide, MW = 300,000 (weighted average), Polyox ® WSRN 3000, Union Carbide, Danbury, Ct.

Example 12

To a solution of 82.0 vol. % methylene chloride and 18.0 vol. % ispropanol were added the following ingredients in the amounts indicated:

| Ingredient | Amount (% of Solids) |
|---|---|
| PMMA[1] | 35.0 |
| PVAc[2] | 59.4 |
| PEG[8] | 4.0 |
| Optical brightener[9] | 0.5 |
| UV stabilizer[9] | 0.5 |
| Polyethylene oxide[8] | 0.5 |
| Anti-oxidant[9] | 0.1 |

[9] optical brightener = 7-(4'-chloro-6-diethyl-amino-1',3',5'-triazine-4-'yl)-amino-3-phenyl-coumarin UV stabilizer = 2-[2'-hydroxy-3',5'-bis-(1'',1''-dimethylpropane)-phenyl]-benzotriazole anti-oxidant = tetra bis[methylene-3-(3',5'-di-t-butyl-4'-hydroxyphenyl)-propionate methane The above solution was cast into a film and laminated onto negative Cromalin ® as in the previous examples. The gloss measured at 20° was 59.3.

Example 13

This example illustrates the use of a two-layer cover film. The following ingredients were added to a methylene chloride/isopropanol (82/18 vol/vol) solution in the amounts given:

| Ingredient | Amount (% of Solids) |
|---|---|
| PMMA[1] | 65.0 |
| PVAc[2] | 29.4 |
| PEG[8] | 4.0 |
| Optical brightener[9] | 0.5 |
| UV stabilizer[9] | 0.5 |
| PEO[8] | 0.5 |
| Anti-oxidant[9] | 0.1 |

This was coated onto a 0.00254 cm thick transparent polyethylene terephtalate support using a 0.0050 cm doctor blade. A second solution was made in methylene chloride of the following ingredients:

| Ingredient | Amount (% of Solids) |
|---|---|
| Polybutadiene, ML-4 (Mooney Viscosity = 55), Diene ® 55AC, Goodyear, Akron, OH | 90.49 |
| Styrene/butadiene (23/77), ML-4 (Mooney Viscosity = 26), Gentro ® 1506, Gencorp, | 9.26 |

-continued

| Ingredient | Amount (% of Solids) |
|---|---|
| Anti-oxidant(9) | 0.25 |

This solution was coated onto a 0.00254 cm thick silicone treated polyethylene terephthalate support using a 0.0050 cm doctor blade. The second film was then laminated to the first film at ambient temperatures such that the two polymeric layers were in contact. The silicone treated polyester support layer was removed and the composite film laminated to a Cromalin ® film as in Example 10. The polyester coversheet was removed and the gloss measurements were made. The gloss of the PMMA, PVAc, PEG film at 20° was 54.0

Example 14

This example illustrates the use of the polymeric films with multicolor surprint proofs.

A four-color proof was made in the following manner:
(1) a layer of positive Cromalin ® (E. I. du Pont de Nemours and Company, Wilmington, DE) was laminated to a plastic coated paper receptor at 250° F;
(2) it was exposed with ultraviolet light under vacuum with a positive separation (yellow) on top of the film for 10 sec. with a 5 Kw light;
(3) the polyester coversheet was removed and a yellow colored film on a polyester support as described in German application P 36 25 014.7 was laminated to the exposed film;
(4) the polyester support containing the yellow colored film was peeled off the receptor leaving behind a positive yellow image;
(5) steps 1–4 were repeated sequentially using positive magenta, cyan, and black separations and magenta, cyan, and black colored films to obtain a four-color surprint proof.

In Example 14-A, the polymeric film of Example 12 was laminated to the four-color proof, and the polyester cover sheet removed. In example 14-B, the dual layer polymeric film of Example 13 was laminated to the four-color proof and the polyester coversheet removed. The gloss measurements were made as above and the results were summarized below. If negative Cromalin ® were used as a coversheet (given an overall exposure and the polyester coversheet left on) the resulting gloss would be expected to be about 107. If positive Cromalin ® were used as a coversheet (given an overall exposure and the polyester coversheet removed) the resulting gloss would be expected to be about 59.

|  | 14-A | 14-B |
|---|---|---|
| GLOSS 20° | 52.7 | 50.7 |

I claim:
1. A method of providing a pre-press color proof with a lower-gloss protective covering, comprising in the stated order the steps of:
(a) providing an element which comprises a thin, substantially transparent, nonphotosensitive, integral polymeric film having a thickness not greater than 0.002 cm on a removable substrate, said polymeric film consisting essentially of a mixture of at least two slightly incompatible polymers, said mixture of slightly incompatible polymers having been dissolved in an essentially organic solvent system, coated on the substrate, and dried, so that said polymeric film exhibits a 20° specular gloss that is at least 5% lower than a film prepared in the same manner from any one of said polymer constituents;
(b) laminating the element to the surface of the pre-press color proof, and,
(c) removing the removable substrate, whereby the polymeric film becomes the outermost layer of the pre-press color proof.
2. A method according to claim 1, wherein the polymeric film has a thickness not greater than 0.001 cm.
3. A method according to claim 1, wherein the polymeric film has a 20° specular gloss that is at least 10% lower than a film prepared from any one of said polymer constituents.
4. A method according to claim 1, wherein the element which is provided comprises, in the stated order, a wetting layer, said polymeric film, and said removable substrate, and wherein the element is laminated to the pre-press color proof with the wetting layer in surface-to-surface contact with the pre-press color proof.
5. A method according to claim 4, wherein the wetting layer comprises an elastomeric polymer.
6. A method according to claim 4, wherein the pre-press color proof is toned with a particulate material.
7. A method according to claim 5, wherein the pre-press color proof is toned with a particulate material.
8. A method according to claim 1, wherein the polymeric film consists essentially of a mixture of at least two sightly incompatible polymers selected from the group consisting of:
(a) an ethylene/vinylacetate copolymer and polymethylmethacrylate;
(b) an ethylene/vinylacetate copolymer, polymethylmethacrylate, and polyvinylacetate;
(c) polycarbonate and polymethylmethacrylate;
(d) polycarbonate and polystyrene;
(e) two different polyamides;
(f) polybutylmethacrylate and a polyamide;
(g) a polyester and polybutylmethacrylate;
(h) a polyester and polystyrene;
(i) polyvinylacetate, polymethylmethacrylate, and polyethylene glycol.
9. A method according to claim 1, wherein the polymeric film consists essentially of a mixture of at least two slightly incompatible polymers selected from the group consisting of:
(a) an ethylene/vinylacetate copolymer and polymethylmethacrylate;
(b) an ethylene/vinylacetate copolymer, polymethylmethacrylate, and polyvinylacetate;
(c) polycarbonate and polymethylmethacrylate;
(d) polycarbonate and polystyrene; and
(e) polyvinylacetate, polymethylmethacrylate, and polyethylene glycol.
10. A method according to claim 9, wherein the polymeric film consists essentially of a mixture of at least two slightly incompatible polymers selected from the group consisting of:
(a) an ethylene/vinylacetate copolymer, polymethylmethacrylate, and polyvinylacetate, and
(b) polymethylmethacrylate, polyvinylacetate, and polyethylene glycol.
11. A method according to claim 10, wherein the polymeric film consists essentially of a mixture of poly- methylmethacrylate, polyvinylacetate, and polyethylene glycol.

12. A method according to claim 11, wherein the polymeric film consists essentially of a mixture of about 10-90% polymethylmethacrylate, 10-90% polyvinylacetate, and 2-30% polyethylene glycol.

13. A method according to claim 12, wherein the polymeric film consists essentially of a mixture of about 65% polymethylmethacrylate, 29% polyvinylacetate, and about 4% polyethylene glycol.

14. A method according to claim 4, wherein the polymeric film consists essentially of a mixture of about 10-90% polymethylmethacrylate, 10-90% polyvinylacetate, and 2-30% polyethylene glycol.

15. A method according to claim 14, wherein the wetting layer comprises an elastomeric polymer.

16. A method according to claim 15, wherein the wetting layer comprises a mixture of 5-95% polybutadiene and 5-95% of a styrene/butadiene copolymer.

17. A method according to claim 14, wherein the polymeric film consists essentially of a mixture of about 65% polymethylmethacrylate, 29% polyvinylacetate, and about 4% polyethylene glycol and wherein the wetting layer comprises a mixture of about 90% polybutadiene and about 9% of a styrene/butadiene copolymer.

18. A method according to claim 4, wherein the polymeric film consists essentially of a mixture of at least two slightly incompatible polymers selected from the group consisting of:
  (a) an ethylene/vinylacetate copolymer and polymethylmethacrylate;
  (b) an ethylene/vinylacetate copolymer, polymethylmethacrylate, and polyvinylacetate;
  (c) polycarbonate and polymethylmethacrylate;
  (d) polycarbonate and polystyrene;
  (e) two different polyamides;
  (f) polybutylmethacrylate and a polyamide;
  (g) a polyester and polybutylmethacrylate;
  (h) a polyester and polystyrene;
  (i) polyvinylacetate, polymethylmethacrylate, and polyethylene glycol.

19. A method according to claim 18, wherein the polymeric film consists essentially of a mixture of at least two slightly incompatible polymers selected from the group consisting of:
  (a) an ethylene/vinylacetate copolymer and polymethylmethacrylate;
  (b) an ethylene/vinylacetate copolymer, polymethylmethacrylate, and polyvinylacetate;
  (c) polycarbonate and polymethylmethacrylate;
  (d) polycarbonate and polystyrene; and
  (e) polyvinylacetate, polymethylmethacrylate, and polyethylene glycol.

20. A method according to claim 19, wherein the polymeric film consists essentially of a mixture of at least two slightly incompatible polymers selected from the group consisting of:
  (a) an ethylene/vinylacetate copolymer, polymethylmethacrylate, and polyvinylacetate, and
  (b) polymethylmethacrylate, polyvinylacetate, and polyethylene glycol.

21. A method according to claim 20, wherein the polymeric film consists essentially of a mixture of polymethylmethacrylate, polyvinylacetate, and polyethylene glycol.

22. A method according to claim 21, wherein the polymeric film consists essentially of about 10-90% polymethylmethacrylate, 10-90% polyvinylacetate, and 2-30% polyethylene glycol.

23. A method according to claim 22, wherein the polymeric film consists essentially of a mixture of about 65% polymethylmethacrylate, about 29% polyvinylacetate, and about 4% polyethylene glycol.

24. A method according to claim 18, wherein the wetting layer comprises an elastomeric polymer.

25. A method according to claim 20, wherein the wetting layer comprises an elastomeric polymer.

26. A method according to claim 25 wherein the wetting layer comprises a mixture of 5-95% polybutadiene and 5-95% of a styrene/butadiene copolymer.

27. A method according to claim 26, wherein the wetting layer comprises a mixture of about 90% polybutadiene and about 9% of a styrene/butadiene copolymer, and wherein the polymeric film consists essentially of a mixture of about 65% polymethylmethacrylate, 29% polyvinylacetate, and about 4% polyethylene glycol.

28. A method according to claim 18, wherein the pre-press color proof is toned with a particulate material.

29. A method according to claim 24, wherein the pre-press color proof is toned with a particulate material.

30. A method of providing a pre-press color proof with a lower-gloss protective covering, comprising in the stated order the steps of:
  (a) preparing an element comprising a thin, substantially transparent, nonphotosensitive, integral polymeric film having a thickness not greater than 0.002 cm on a removable substrate, comprising the steps of:
    (i) dissolving at least two slightly incompatible polymers in an essentially organic solvent system,
    (ii) coating this polymer solution on an appropriate substrate, and
    (iii) drying, so that the thus-formed polymeric film exhibits a 20° specular gloss that is at least 5% lower than a film prepared in the same manner from any one of said polymer constituents;
  (b) laminating the element prepared in step (a) to the surface of the pre-press color proof; and,
  (c) removing the removable substrate,
    whereby the polymeric film becomes the outermost layer of the pre-press color proof.

31. A method according to claim 30, wherein the polymeric film has a thickness not greater than 0.001 cm.

32. A method according to claim 30, wherein the polymeric film exhibits a 20° specular gloss that is at least 10% lower than a film prepared in the same manner from any one of said polymer constituents.

33. A method according to claim 30, wherein the polymeric film consists essentially of a mixture of at least two slightly incompatible polymers selected from the group consisting of:
  (a) an ethylene/vinylacetate copolymer and polymethylmethacrylate;
  (b) an ethylene/vinylacetate copolymer, polymethylmethacrylate, and polyvinylacetate;
  (c) polycarbonate and polymethylmethacrylate;
  (d) polycarbonate and polystyrene;
  (e) two different polyamides;
  (f) polybutylmethacrylate and a polyamide;
  (g) a polyester and polybutylmethacrylate;

(h) a polyester and polystyrene;
(i) polyvinylacetate, polymethylmethacrylate, and polyethylene glycol.

34. A method according to claim 33, wherein the polymeric film consists essentially of a mixture of at least two slightly incompatible polymers selected from the group consisting of:
(a) an ethylene/vinylacetate copolymer, polymethylmethacrylate, and polyvinylacetate, and
(b) polymethylmethacrylate, polyvinylacetate, and polyethylene glycol.

35. A method according to claim 34, wherein the polymeric film consists essentially of a mixture of polymethylmethacrylate, polyvinylacetate, and polyethylene glycol.

36. A method according to claim 35, wherein the polymeric film consists essentially of a mixture of about 10–90% polymethylmethacrylate, 10–90% polyvinylacetate, and 2–30% polyethylene glycol.

37. A method according to claim 30, wherein the element prepared in step (a) comprises, in the stated order, a wetting layer, said polymeric film, and said removable substrate, and wherein the element is laminated to the pre-press color proof with the wetting layer in surface-to-surface contact with the pre-press color proof.

38. A method according to claim 37, wherein the pre-press color proof is toned with a particulate toner.

39. A method according to claim 37, wherein the wetting layer comprises an elastomeric polymer.

40. A method according to claim 39, wherein the pre-press color proof is toned with a particulate toner.

41. A method according to claim 37, wherein the polymeric film consists essentially of a mixture of at least two slightly incompatible polymers selected from the group consisting of:
(a) an ethylene/vinylacetate copolymer and polymethylmethacrylate;
(b) an ethylene/vinylacetate copolymer, polymethylmethacrylate, and polyvinylacetate;
(c) polycarbonate and polymethylmethacrylate;
(d) polycarbonate and polystyrene;
(e) two different polyamides;
(f) polybutylmethacrylate and a polyamide;
(g) a polyester and polybutylmethacrylate;
(h) a polyester and polystyrene;
(i) polyvinylacetate, polymethylmethacrylate, and polyethylene glycol.

42. A method according to claim 41, wherein the polymeric film consists essentially of a mixture of at least two slightly incompatible polymers selected from the group consisting of:
(a) an ethylene/vinylacetate copolymer, polymethylmethacrylate, and polyvinylacetate, and
(b) polymethylmethacrylate, polyvinylacetate, and polyethylene glycol.

43. A method according to claim 42, wherein the polymeric film consists essentially of a mixture of polymethylmethacrylate, polyvinylacetate, and polyethylene glycol, and the wetting layer comprises a mixture of polybutadiene and a styrene/butadiene copolymer.

* * * * *